(12) United States Patent
Etgar (10) Patent No.: US 10,079,356 B2
(45) Date of Patent: Sep. 18, 2018

(54) PEROVSKITE SCHOTTKY TYPE SOLAR CELL

(71) Applicant: YISSUM RESEARCH DEVELOPMENT COMPANY OF THE HEBREW UNIVERSITY OF JERUSALEM LTD., Jerusalem (IL)

(72) Inventor: Lioz Etgar, Jerusalem (IL)

(73) Assignee: Yissum Research Development Company of the Hebrew University of Jerusalem Ltd., Jerusalem (IL)

( * ) Notice: Subject to any disclaimer, the term of this patent is extended or adjusted under 35 U.S.C. 154(b) by 0 days.

(21) Appl. No.: 14/652,528

(22) PCT Filed: Dec. 19, 2013

(86) PCT No.: PCT/IL2013/051044
§ 371 (c)(1),
(2) Date: Jun. 16, 2015

(87) PCT Pub. No.: WO2014/097299
PCT Pub. Date: Jun. 26, 2014

(65) Prior Publication Data
US 2015/0340632 A1    Nov. 26, 2015

Related U.S. Application Data

(60) Provisional application No. 61/740,147, filed on Dec. 20, 2012.

(51) Int. Cl.
*H01L 31/00* (2006.01)
*H01L 51/42* (2006.01)
*H01L 51/00* (2006.01)

(52) U.S. Cl.
CPC ...... *H01L 51/4226* (2013.01); *H01L 51/0077* (2013.01); *H01L 51/0036* (2013.01); *H01L 2251/306* (2013.01); *Y02E 10/549* (2013.01)

(58) Field of Classification Search
None
See application file for complete search history.

(56) References Cited

U.S. PATENT DOCUMENTS

| | | | |
|---|---|---|---|
| 2004/0129922 A1* | 7/2004 | Shibuya | C09K 11/06 252/301.36 |
| 2008/0283122 A1* | 11/2008 | Campbell | C09B 47/00 136/265 |
| 2009/0022971 A1* | 1/2009 | Cole | C23C 18/1208 428/220 |
| 2011/0214728 A1* | 9/2011 | Veerasamy | B82Y 10/00 136/256 |
| 2012/0017976 A1 | 1/2012 | Nechache et al. | |
| 2012/0132272 A1* | 5/2012 | Steirer | H01L 51/4253 136/256 |

(Continued)

OTHER PUBLICATIONS

Im et al., Nanoscale, 2011, 3, 4088, published on Sep. 7, 2011.*

(Continued)

*Primary Examiner* — Eli Mekhlin
(74) *Attorney, Agent, or Firm* — Vorys, Sater, Seymour and Pease LLP (57) ABSTRACT

The invention provides devices such as photovoltaic cells which are free of scaffold structure layers.

17 Claims, 3 Drawing Sheets (56) References Cited

U.S. PATENT DOCUMENTS

2013/0233377 A1* 9/2013 Kanatzidis ............ H01L 31/032
136/252

OTHER PUBLICATIONS

Chen et al., Appl. Phys. Lett. 2012, 101, 093901.*
Kojima et al., "Highly Luminescent Lead Bromide Perovskite Nanoparticles Synthesized with Porous Alumina Media," Chem. Lett., 2012, vol. 41, pp. 397-399, with supporting information.
Kagan et al., "Organic-Inorganic Hybrid Materials as Semiconducting Channels in Thin-Film Field-Effect Transistors," Science, Oct. 1999, vol. 286, pp. 945-947.
Mitzi et al., "Transport, Optical, and Magnetic Properties of the Conducting Halide Perovskite $CH_3NH_3SnI_3$," Journal of Solid State Chemistry, 1995, vol. 114, pp. 159-163.
Kojima et al., "Organometal Halide Perovskites as Visible-Light Sensitizers for Photovoltaic Cells," J. Am. Chem. Soc., 2009, vol. 131, No. 17, pp. 6050-6051.
Im et al., "Synthesis, Structure, and Photovoltaic Property of a Nanocrystalline 2H Perovskite-Type Novel Sensitizer $(CH_3CH_2NH_3)PbI_3$," Nanoscale Research Letters, 2012, vol. 7, No. 353, pp. 1-7.
Im et al., "6.5% Efficient Perovskite Quantum-Dot-Sensitized Solar Cell," Nanoscale, 2011, vol. 3, pp. 4088-4093.

Lee et al., "Efficient Hybrid Solar Cells Based on Meso-Superstructured Organometal Halide Perovskites," Science, Nov. 2012, vol. 338, pp. 643-647.
Kim et al., "Lead Iodide Perovskite Sensitized All-Solid-State Submicron Thin Film Mesoscopic Solar Cell with Efficiency Exceeding 9%," Scientific Reports, 2012, vol. 2, No. 591, pp. 1-7, with supporting information.
Etgar et al., "Mesoscopic $CH_3NH_3PbI_3$/$TiO_2$ Heterojunction Solar Cells," J. Am. Chem. Soc., 2012, vol. 134, pp. 17396-19399.
Chen et al., "Schottky Solar Cells Based on $CsSnI_3$ Thin-Films," Applied Physics Letters, 2012, vol. 101, No. 9, pp. 093901-1 thru 093901-4.
Liu et al., "Efficient Planar Heterojunction Perovskite Solar Cells by Vapour Deposition," Nature, Sep. 2013, vol. 501, pp. 395-398, with supporting information.
Laban et al., "Depleted Hole Conductor-Free Lead Halide Iodide Heterojunction Solar Cells," Energy & Environmental Science, 2013, vol. 6, pp. 3249-3253.
Etgar et al., "Enhancing the Open Circuit Voltage of Dye Sensitized Solar Cells by Surface Engineering of Silica Particles in a Gel Electrolyte," Journal of Materials Chemistry A, 2013, vol. 1, pp. 10142-10147.
Etgar et al., "Core/Shell PbSe/PbS QDs $TiO_2$ Heterojunction Solar Cell," Advanced Functional Materials, 2013, vol. 23, pp. 2736-2741.
Zheng; "Development of Photoelectric Materials with Organic-inorganic Hybrid Perovskite Structure;" 2008; Series No. 1; No. 9; pp. B020-12.

* cited by examiner

PEROVSKITE SCHOTTKY TYPE SOLAR CELL

TECHNOLOGICAL FIELD

The invention generally relates to a novel type of a solar cell.

BACKGROUND

Organic-inorganic perovskites are attractive materials to be used as light harvesters in solar cells. A promising organic-inorganic perovskites to be used in solar cell is the organo-lead halide perovskites. They have direct band gap, large absorption coefficients [1,2] and high carrier mobility [3]. Their electronic properties can be tailored, allowing for the formation of layered materials, to control the distance and the electronic coupling between the inorganic sheets according to the structure of the organic component employed. The layered perovskites have high stability in dry air.

Several studies report using $CH_3NH_3PbI_3$ perovskite nanocrystals as sensitizers in photoelectron-chemical cells with liquid electrolyte [4-6]. However, the performance of these systems rapidly declines due to dissolution of the perovskite.

Snaith et al. [7] and Grätzel et al. [8] reported on efficient hybrid organic-inorganic solar cells, based on a meso-superstructured organo halide perovskite, yielding power conversion efficiency of exceeding 10%.

In addition, Etgar et al.[9] reported on the use of hole-conductor free perovskite heterojunction solar cells. The authors found that the lead halide perovskite could transport holes, in addition to its functionality as an absorber, achieving impressive photovoltaic performance with power conversion efficiency of more than 7% under low light intensity. Etgar et al also discloses mesoscopic $CH_3NH_3PbI_3/TiO_2$ heterojunction solar cells, comprising mesoscopic methylammonium lead iodide ($CH_3NH_3PbI_3$) perovskite/$TiO_2$, produced by deposition of perovskite nanoparticles from a solution of $CH_3NH_3I$ and $PbI_2$ in γ-butyrolactone on a 400 nm thick film of $TiO_2$ (anatase) nanosheets. The presence of $TiO_2$ was found critical as the authors held that $TiO_2$ was needed as a scaffold mainly in order to increase the surface area.

REFERENCES

[1] Akihiro Kojima; Masashi Ikegami; KenjiroTeshima; and Tsutomu Miyasaka. Highly Luminescent Lead Bromide Perovskite Nanoparticles Synthesized with Porous Alumina Media *Chem. Lett.* 2012, 41, 397.
[2] C. R. Kagan; D. B. Mitzi; C. D. Dimitrakopoulos. Organic-Inorganic Hybrid Materials as Semiconducting Channels in Thin-Film Field-Effect Transistors. *Science,* 1999, 286, 945.
[3] D. B Mitzi; C. A. Feild; Z. Schlesinger; R. B. Laibowitz. Transport Optical and Magnetic properties of the conducting Halide Perovskite $CH_3NH_3SnI_3$. *J. Solid State Chem.* 1995, 114, 159.
[4] Kojima, A.; Teshima K.; Shirai, Y.; Miyasaka, T. Organometal Halide Perovskites as Visible-Light Sensitizers for Photovoltaic Cells. *J. Am. Chem. Soc.* 2009, 131, 6050-6051.
[5] Hyoeklm, J.; Chung, J.; Kim, S.-J.; Park, N.-G. Synthesis, structure, and photovoltaic property of a nanocrystalline 2H perovskite-type novel sensitizer ($CH_3CH_2NH_3$) $PbI_3$ *Nanoscale Research Letters,* 2012, 7, 353.
[6] Hyoeklm, J.; Lee, C.-R.; Lee, J.-W.; Park, S.-W.; Park, N.-G. 6.5% efficient perovskite quantum-dot-sensitized solar cell. *Nanoscale.* 2011, 3, 4088.
[7] Lee, M.; Teuscher, M. J.; Miyasaka, T.; Murakami, T N.; Snaith, H. J. Efficient Hybrid Solar Cells Based on Meso-SuperstructuredOrganometal Halide Perovskites. *Science* 2012, 338, 643-644.
[8] Kim, H.-S.; Lee, C.-R.; Im, J.-H.; Lee, K.-B.; Moehl, T.; Marchioro, A.; Moon, S.-J.; Baker, R. Humphry; Yum, J. H.; Moser, J. E.; Grátzel, M.; Park, N.-G. Lead Iodide Perovskite Sensitized All-Solid-State Submicron Thin Film Mesoscopic Solar Cell with Efficiency Exceeding 9%. *Nature Scientific Reports* 2012, 2, 591.
[9] Etgar, L.; Gao, P.; Xue, Z.; Peng, Q.; Chandiran, A. K.; Liu, B.; Nazeeruddin, Md. K.; Graetzel, M. Mesoscopic $CH_3NH_3PbI_3/TiO_2$Heterojunction Solar Cells. *J. Am. Chem. Soc.* 2012, 134, 17396-17399.

SUMMARY OF THE INVENTION

Presently known solar cells or heterojunctions based on organic-inorganic perovskites utilize a scaffold layer (e.g., $TiO_2$ layer) which is considered as a critical component in such cells. The scaffold layer is typically situated between the perovskite layer and the glass substrate. This is mainly due to the fact that the scaffold layer increases the surface area and therefore assists in reducing or diminishing recombination processes and therefore increases the device efficiency.

The present invention is based on the surprising finding that efficient perovskite solar cells can be produced from perovskite materials without needing to include in the solar cells a surface increasing scaffold structure layer.

Thus, the present invention provides a novel stacked layer element which may be utilized in optoelectronic devices, wherein the device is free of a surface-increasing scaffold structure/layer. These devices are improved optoelectronic devices/heterojunctions/photovoltaic cells. The stacked layers of the invention, as will be further demonstrated hereinbelow, exhibit one or more of the following characteristics:

1. Stacked layers have a simple structure and as an outcome of the elimination of the surface-increasing scaffold component, permit construction of cost-effective and easily constructed devices.
2. Formation of stacked layers at low temperatures and/or simple deposition step(s), since the process avoids application of a surface-increasing scaffold structure, and therefore provides cost effective devices.
3. Stacked layers being flexible and/or deposited on flexible substrates and/or heat sensitive surfaces, therefore broadening the selection of substrates which can be used and the end applications.
4. Stacked layers that are less affected by charge carrier recombination, as the depletion layer of the heterojunction/photovoltaic cell/device is very close to the surface.
5. Stacked layers provide high current density devices.

Thus, the invention provides in one of its aspects an element comprising (or consisting) a substrate, at least one perovskite layer (e.g., organic-inorganic), a conductive layer, and optionally at least one additional layer, wherein the at least one perovskite layer is provided on said substrate, either directly on the substrate or on the at least one additional layer positioned on said substrate, wherein said at least one additional layer being different from a scaffold structure layer.

In some embodiments, the substrate is the bottom most layer on top of which a perovskite layer is provided; and a conductive layer is provided on top of the perovskite layer. The at least one additional layer, not being a scaffold structure layer, may be an intervening layer between any one of the aforementioned substrate, perovskite and conductive layers, or as a top-most layer on top of said conductive layer.

The invention also provides an element comprising a substrate, at least one perovskite layer, a conductive layer, and optionally at least one additional layer, wherein said element is devoid of (or free of) a scaffold structure layer.

The invention also provides an element comprising a substrate, at least one perovskite layer, a conductive layer, optionally at least one additional layer, and further optionally at least one scaffold structure layer, wherein the perovskite layer is directly provided on said substrate.

The invention further provides an element comprising a substrate, at least one perovskite layer, a conductive layer, and optionally at least one additional layer, wherein the at least one perovskite layer on said substrate provides a planar junction; namely a scaffold structure layer is not provided between the substrate and the perovskite layer.

The invention further provides an element comprising a substrate, at least one perovskite layer, a conductive layer, and optionally at least one additional layer, wherein the at least one perovskite layer is positioned directly on said substrate.

As may be understood from the disclosure provided herein, the gist of the present invention is providing an element which may be used as or implemented to an optoelectronic device, wherein the element is free of a scaffold structure layer. As known in the art, a scaffold layer increases the surface area of an optoelectronic cell (e.g., solar cell) and therefore may provide a non-planar junction. The ability to implement a cell not having a scaffold layer is therefore surprising. In perovskite-based cells, the scaffold layer is typically positioned between the substrate surface and the perovskite layer. IN the elements and devices of the invention such a scaffold layer is not required, and thus, the elements or devices lack a layer which increases the effective surface (i.e., increase surface area) of the layer onto which a perovskite layer is applied.

In some embodiments, where at least one additional layer is present between the substrate and the perovskite layer, the additional layer is not one which increases the effective surface area of the substrate, namely the at least one additional layer characterized by one or more of the following:
  the layer is not a porous layer or a layer comprising a fine powder;
  the layer is not nanostructured and/or nanoporous;
  the layer does not comprise powder (particles) in form of nanoparticles; typically having a diameter in the range of a few hundreds to a few nanomemeters (n some embodiments, the nanoparticles size is between 1 nm and 500 nm; in some embodiments, the nanoparticles size is between 1 nm and 300 nm; in some embodiments, the nanoparticles size is between 3 nm and 300 nm; in some embodiments, the nanoparticles size is between 3 nm and 200 nm); and
  the layer increases the surface area per volume of the substrate surface or of the surface in (direct) contact with the perovskite layer by less than 1.1 or 1.2 or 1.25 or 1.5 or 1.75 or 2 or 2.5 or 3 or 3.5 or 4 or 4.5 or 5.

The at least one additional layer is said not to "increase the surface area" of a substrate onto which it is positioned. Similarly, the elements of the invention are free of scaffold layers which "increase the surface area" of a substrate. In other words, in embodiments where a substrate of an element of the invention is coated or layered with an intervening layer (e.g., at least one additional layer) which separates the substrate from the perovskite layer, the intervening layer may not be one which increases the total surface area of the element substrate. In some embodiments the surface area is the total surface area of the substrate or additional layer. In some embodiments, the surface area is one or more faces (e.g., top) of the substrate or additional layer, wherein the one or more faces is the face on which the perovskite layer is provided. In some embodiments, the surface area is the surface that is in (direct) contact with the perovskite layer. The area refers to a full or partial or continuous or spaced apart regions of the substrate surface.

In some embodiments, the at least one additional layer is positioned between the substrate and a perovskite layer, the at least one additional layer being composed of a semiconductive or a metal oxide material which does not increase the surface area of the substrate surface.

As known in the art, the "perovskite layer" or "perovskite material" refers to a material comprising or consisting of one or more perovskite species, which encompass any perovskite structure known in the art.

The perovskite material is typically characterized by the structural motif $AMX_3$, having a three-dimensional network of corner-sharing $MX_6$ octahedra, wherein M is a metal cation that may adopt an octahedral coordination of the X anions, and wherein A is a cation typically situated in the 12-fold coordinated holes between the $MX_6$ octahedra.

In some embodiments, A and M are metal cations, i.e., the perovskite material is a metal oxide perovskite material. In other embodiments, A is an organic cation and M is a metal cation, i.e., the perovskite material is an organic-inorganic perovskite material.

The organic-inorganic perovskite material is an organic-inorganic hybrid structure. The organic-inorganic material encompasses self-assembled arrangements as alternate sheets, wherein the electronic coupling between the sheets and their distance from each other control the electronic properties. The organic-inorganic perovskite structure of the invention encompasses any such structure known in the art.

The organic component may consist of a plurality of sheets, one or more, each comprising organic cations. In some embodiments, the organic component is composed of a single organic sheet (e.g., mono-ammonium), the cations and halogens being in one inorganic sheet, with the organic groups extending into a space between the inorganic sheets. In other embodiments, where the organic component is composed of two sheets (e.g., di-ammonium cations), the molecules extend into the distance between the organic sheets, which means that no van der Waals forces exist between the sheets.

The organic groups may comprise an alkyl chain or a single-ring aromatic group. These simple organic layers help define the degree of interaction between the inorganic sheets and the properties developing in the inorganic sheets. These important modifications may be the result of changing the stoichiometry or composition of the organic and inorganic salts in the precursors solution used to grow the films or crystals. The layered (multiple sheets) perovskite described demonstrates that the inorganic sheets can determine the formation of single crystalline layers, which would achieve higher mobilities (higher electron and holes mobilities).

In some embodiments, the structure of the organic-inorganic perovskites resembles a multilayer structure, with semiconducting inorganic sheets alternating with organic sheets. The organic sheets may have a large energy gap.

In some embodiments, the conduction band of the inorganic sheets is substantially below that of the organic sheets, and the valence band of the inorganic sheets may be similarly above that of the organic sheets, forming a type I band structure. In some embodiments, the band gaps of the organic and inorganic sheets may be in a staggered configuration forming type II band structure.

In some embodiments, the perovskite material is a three-dimensional material. In some embodiments, the perovskite material is a two-dimensional material.

In some embodiments, the perovskite material is of the formula $AMX_3$ or $AMX_4$ or $A_2MX_4$ or $A_3MX_5$ or $A_2A'MX_5$ or $AMX_{3-n}X'_n$, wherein A and A' are independently selected from organic cations, metal cations and any combination of such cations;

M is a metal cation or any combination of metal cations;

X and X' are independently selected from anions and any combination of anions; and n is between 0 to 3.

Repeating or multiple elements in any of the above perovskite formulae (e.g., $A_2$ or $X_4$ in $A_2MX_4$) may be the same or different. For example, $A_2MX_4$ may actually be of the structure AA'MXX'X"X"'.

The cation and anion moieties may be in any valence number. In some embodiments, the cation and/or the anion have a valence number of 1 or 2 or 3 or 4 or 5 or 6 or 7. In some embodiments, the cation and/or the anion is a monovalent atom. In some embodiments, the cation and/or the anion is a divalent atom. In some embodiments, the cation and/or the anion is a trivalent atom.

The metal cations may be selected from metal element of Groups IIIB, IVB, VB, VIB, VIIB, VIIIB, IB, IIB, IIIA, IVA and VA of block d of the Periodic Table of the Elements.

In some embodiments, the metal cation is Li or Mg or Na or K or Rb or Cs or Be or Ca or Sr or Ba, Sc or Ti or V or Cr or Fe or Ni or Cu or Zn or Y or La or Zr or Nb or Tc or Ru or Mo or Rh or W or Au or Pt or Pd or Ag or Co or Cd or Hf or Ta or Re or Os or Ir or Hg or B or Al or Ga or In or Tl or C or Si or Ge or Sn or Pb or P or As or Sb or Bi or O or S or Se or Te or Po or any combination thereof.

In some embodiments, the metal cation is a transition metal selected from Groups IIIB, IVB, VB, VIB, VIIB, VIIIB, IB and IIB of block d the Periodic Table. In some embodiments, the transition metal is a metal selected from Sc, Ti, V, Cr, Mn, Fe, Ni, Cu, Zn, Y, Zr, Nb, Tc, Ru, Mo, Rh, W, Au, Pt, Pd, Ag, Mn, Co, Cd, Hf, Ta, Re, Os, Ir and Hg or any combination thereof.

In some embodiments, the metal cation is a post-transition metal selected from Group IIIA, IVA and VA. In some embodiments, the metal cation is Al or Ga or In or Tl or Sn or Pb or Bi or any combination thereof.

In some embodiments, the metal cation is a semi-metal selected from Group IIIA, IVA, VA and VIA. In some embodiments, the metal cation is B or Si or Ge or As or Sb or Po or any combination thereof.

In some embodiments, the metal cation is an alkali metal selected from Group IA. In some embodiments, the metal cation is an alkali metal Li or Mg or Na or K or Rb or Cs.

In some embodiments, the metal cation is an alkaline earth metal selected from Group IIA. In some embodiments, the metal cation is Be or Ca or Sr or Ba.

In some embodiments, the metal cation is a lanthanide element such as Ce or Pr or Gd or Eu or Tb or Dy or Er or Tm or Nd or Yb or any combination thereof.

In some embodiments, the metal cation is an actinides element such as Ac or Th or Pa or U or Np or Pu or Am or Cm or Bk or Cf or Es or Fm or Md or No or Lr or any combination thereof.

In some embodiments, the metal cation is a divalent metal cation. Non-limiting examples of divalent metals include $Cu^{+2}$, $Ni^{+2}$, $Co^{+2}$, $Fe^{+2}$, $Mn^{+2}$, $Cr^{+2}$, $Pd^{+2}$, $Cd^{+2}$, $Ge^{+2}$, $Sn^{+2}$, $Pb^{+2}$, $Eu^{+2}$ and $Yb^{+2}$.

In some embodiments, the metal cation is a trivalent metal cation. Non-limiting examples of trivalent metals include $Bi^{+3}$ and $Sb^{+3}$.

In some embodiments, the metal cation is $Pb^{+2}$

The organic cations are cations comprising at least one organic moiety (containing one or more carbon chain or hydrocarbon chain or one or more organic group).

The organic moiety may be selected from substituted or unsubstituted alkyl, substituted or unsubstituted alkenyl, substituted or unsubstituted alkynyl, substituted or unsubstituted cycloalkyl, substituted or unsubstituted cycloalkenyl, substituted or unsubstituted cycloalkynyl, substituted or unsubstituted aryl, substituted or unsubstituted heteroaryl, substituted or unsubstituted heterocyclyl, substituted or unsubstituted —$NR_1R_2$, substituted or unsubstituted —$OR_3$, substituted or unsubstituted —$SR_4$, substituted or unsubstituted —$S(O)R_5$, substituted or unsubstituted alkylene-COOH, and substituted or unsubstituted ester.

The variable group denoted by "R" refers to one or more group selected from hydrogen, alkyl, alkenyl, alkynyl, cycloalkyl, cycloalkenyl, cycloalkynyl, aryl, heteroaryl, heterocyclyl, halogen, alkylene-COOH, ester, —OH, —SH, and —NH, as defined herein or any combination thereof. In some embodiments, the number of R groups may be 0 or 1 or 2 or 3 or 4 or 5 or 6 or 7 or 8 or 9 or 20. As used herein, the group R refers generically to any specific R used herein, unless a specific definition is provided; in other words, the aforementioned definition refers to any of the R groups, e.g., R', R", R"', R"", $R_2$, $R_3$, $R_4$, $R_5$, $R_6$, $R_7$, $R_8$, etc., unless otherwise specifically noted.

In some embodiments, the perovskite material is a single species of a perovskite material. In other embodiments, the perovskite material is a combination of two or more (several) different species of different perovskite materials. In some embodiments, the number of different species of different perovskite materials may be 2 or 3 or 4 or 5 or 6 or 7 or 8 or 9 or 10 perovskite different perovskite species.

In some embodiments, the perovskite layer is a multilayer structure of layered perovskite materials, wherein each layer is different and comprises either a different species of a perovskite material, or a different mixture of several different species of perovskite materials. In some embodiments, each layer in a perovskite multilayer is made of a different combination or the same combination but with different ratios of perovskite materials.

In some embodiments, where the perovskite layer is in the form of a multilayered perovskite material, the perovskite layers may each be of the same perovskite material or of different perovskite materials. In some embodiments, the multilayer perovskite comprises 2 or 3 or 4 or 5 or 6 or 7 or 8 or 9 or 10 perovskite layers.

In some embodiments, the perovskite layer comprises 2 or 3 or 4 or 5 or 6 or 7 or 8 or 9 or 10 different perovskite materials, each being selected and defined as above.

In some embodiments, the perovskite layer comprises two perovskite materials at a ratio of 1:1 or 1:2 or 1:3 or 1:4 or 1:5.

In the organic moieties comprising the organic-inorganic hybrid material, the following definitions are applicable:

"alkyl", "alkenyl" and "alkynyl" carbon chains, if not specified, refers to carbon chains each containing from 1 to 20 carbons, or 1 or 2 to 16 carbons, and are straight or branched. Each such group may be substituted. In some embodiments, the carbon chain contains 1 to 10 carbon atoms. In some embodiments, the carbon chain contains 1 to 6 carbon atoms. In some embodiments, the carbon chain contains 2 to 6 carbon atoms. Alkenyl carbon chains may contain from 2 to 20 carbons, or 2 to 18 carbons, or 2 to 16 carbons, or 2 to 14 carbons, or 2 to 12 carbons, or 2 to 10 carbons, or 2 to 8 carbons, or 2 to 6 carbons, or 2 to 4 carbons. The alkenyl carbon chain may similarly contain 1 to 8 double bonds, or 1 to 7 double bonds, or 1 to 6 double bonds, or 1 to 5 double bonds, or 1 to 4 double bonds, or 1 to 3 double bonds, or 1 double bond, or 2 double bonds. Alkynyl carbon chains from 2 to 20 carbons, or 2 to 18 carbons, or 2 to 16 carbons, or 2 to 14 carbons, or 2 to 12, or carbons 2 to 10 carbons, or 2 to 8 carbons, or 2 to 6 carbons, or 2 to 4 carbons. The alkynyl carbon chain may similarly contain 1 to 8 triple bonds, or 1 to 7 triple bonds, or 1 to 6 triple bonds, or 1 to 5 triple bonds, or 1 to 4 triple bonds, or 1 to 3 triple bonds, or 1 triple bond, or 2 triple bonds. Exemplary alkyl, alkenyl and alkynyl groups include, but are not limited to, methyl, ethyl, propyl, isopropyl, isobutyl, n-butyl, sec-butyl, tert-butyl, isohexyl, allyl (propenyl) and propargyl (propynyl).

"cycloalkyl" refers to a saturated mono- or multi-cyclic ring system, in certain embodiments of 3 to 10 carbon atoms, in other embodiments 3 to 6 carbon atoms; cycloalkenyl and cycloalkynyl refer to mono- or multicyclic ring systems that respectively include at least one double bond and at least one triple bond. Cycloalkenyl and cycloalkynyl groups may, in some embodiments, may contain between 3 to 10 carbon atoms, in further embodiments, between 4 to 7 carbon atoms and cycloalkynyl groups, in further embodiments, containing 8 to 10 carbon atoms. The ring systems of the cycloalkyl, cycloalkenyl and cycloalkynyl groups may be composed of one ring or two or more rings which may be joined together in a fused, bridged or spiro-connected fashion.

"aryl" refers to aromatic monocyclic or multicyclic groups containing from 6 to 10 carbon atoms. Aryl groups include, but are not limited to groups such as unsubstituted or substituted fluorenyl, unsubstituted or substituted phenyl, and unsubstituted or substituted naphthyl.

"heteroaryl" refers to a monocyclic or multicyclic aromatic ring system, in certain embodiments, of about 5 to about 15 members where one or more, in some embodiments 1 to 3, of the atoms in the ring system is a heteroatom, that is, an element other than carbon, including e.g., nitrogen, oxygen or sulfur. The heteroaryl group may be optionally fused to a benzene ring. Heteroaryl groups include, but are not limited to, furyl, imidazolyl, pyrimidinyl, tetrazolyl, thienyl, pyridyl, pyrrolyl, thiazolyl, isothiazolyl, oxazolyl, isoxazolyl, triazolyl, quinolinyl and isoquinolinyl.

"heterocyclyl" refers to a saturated mono- or multi-cyclic ring system, in one embodiment of 3 to 10 members, in another embodiment of 4 to 7 members, in a further embodiment of 5 to 6 members, where one or more, in certain embodiments, 1 to 3, of the atoms in the ring system is a heteroatom, that is, an element other than carbon, including but not limited to, nitrogen, oxygen or sulfur. In embodiments where the heteroatom(s) is nitrogen, the nitrogen is optionally substituted with alkyl, alkenyl, alkynyl, aryl, heteroaryl, aralkyl, heteroaralkyl, cycloalkyl, heterocyclyl, cycloalkylalkyl, heterocyclylalkyl, acyl, guanidine, or the nitrogen may be quaternized to form an ammonium group where the substituents are selected as above.

"—$NR_1R_2$" refers to an amine group wherein $R_1$ and $R_2$ are independently selected from hydrogen, alkyl, alkenyl, alkynyl, cycloalkyl, cycloalkenyl, cycloalkynyl, aryl, heteroaryl, heterocyclyl, ester and carbonyl, each as defined herein or alternatively known in the art.

"—$OR_3$" refers to a hydroxyl group or an alkoxy group or derivative, wherein $R_3$ is selected from hydrogen, alkyl, alkenyl, alkynyl, cycloalkyl, cycloalkenyl, cycloalkynyl, aryl, heteroaryl, heterocyclyl, halogen, sulfinyl, ester and carbonyl.

"—$SR_4$" refers to a thiol group or a thioether group or derivative, wherein $R_4$ is selected from hydrogen, alkyl, alkenyl, alkynyl, cycloalkyl, cycloalkenyl, cycloalkynyl, aryl, heteroaryl, heterocyclyl, halogen, sulfinyl, ester and carbonyl.

"—$S(O)R_5$" refers to a sulfinyl group, wherein $R_5$ is selected from hydrogen, alkyl, alkenyl, alkynyl, cycloalkyl, cycloalkenyl, cycloalkynyl, aryl, heteroaryl, heterocyclyl, halogen, sulfinyl, ester and carbonyl.

"ester" refers to —$C(O)OR_8$ in which $R_8$ is selected from hydrogen, alkyl, alkenyl, alkynyl, cycloalkyl, cycloalkenyl, cycloalkynyl, aryl, heteroaryl, heterocyclyl, halogen, —$NR_1R_2$, sulfinyl, carbonyl, —$OR_3$, $SR_4$, —$S(O)R_5$ —OH, —SH and —NH.

The term "substituted" refers to any group or any ligand as defined herein above having (further substituted) one or more substituent, wherein the substituent is a ligand as defined herein above. In some embodiments, the substituent is selected from alkyl, alkenyl, alkynyl, cycloalkyl, cycloalkenyl, cycloalkynyl, aryl, heteroaryl, heterocyclyl, halogen, alkylene-COOH, ester, —OH, —SH, and —NH. In some embodiments, the number of substituents on a certain ligand is 0 or 1 or 2 or 3 or 4 or 5 or 6 or 7 or 8 or 9 or 20 substituents.

The anion may be a simple anion or a halide anion or a chalcogenide anion or an organic anion or an oxoanion or any combination thereof.

In some embodiments, the anion is a simple anion, such as $O^{-2}$, $N^{-3}$, $S^{-2}$ or any combination thereof.

In some embodiments, the anion is a halide anion, wherein the halide may be F, Cl, Br, I, At or any combination thereof.

In some embodiments, the anion is selected from anions of an atom selected from S, Se, Te and any combination thereof.

In some embodiments, the anion is selected amongst organic anions such as acetate ($CH_3COO^-$), formate ($HCOO^-$), oxalate ($C_2O_4^{-2}$), cyanide ($CN^-$) or any combination thereof.

In some embodiments, the anion is a oxoanion such as $AsO_4^{-3}$, $AsO_3^{-3}$, $CO_3^{-2}$, $HCO_3^-$, $OH^-$, $NO_3^-$, $NO_2^-$, $PO_4^{-3}$, $HPO_4^{-2}$, $SO_4^{-2}$, $HSO_4^-$, $S_2O_3^{-2}$, $SO_3^{-2}$, $ClO_4^-$, $ClO_3^-$, $ClO_2^-$, $OCl^-$, $IO_3^-$, $BrO_3^-$, $OBr^-$, $CrO_4^{-2}$, $Cr_2O_7^{-2}$ or any combination thereof.

In some embodiments, the anion may be selected from $Br^-$, $I^-$, $NCS^-$, $CN^-$, and $NCO^-$. In further embodiments, the anion may be selected from $IBr^{-3}$, $Cl_2I^{-3}$, $Br_2I^{-3}$ and $I_2Cl^{-3}$.

Figure 1:
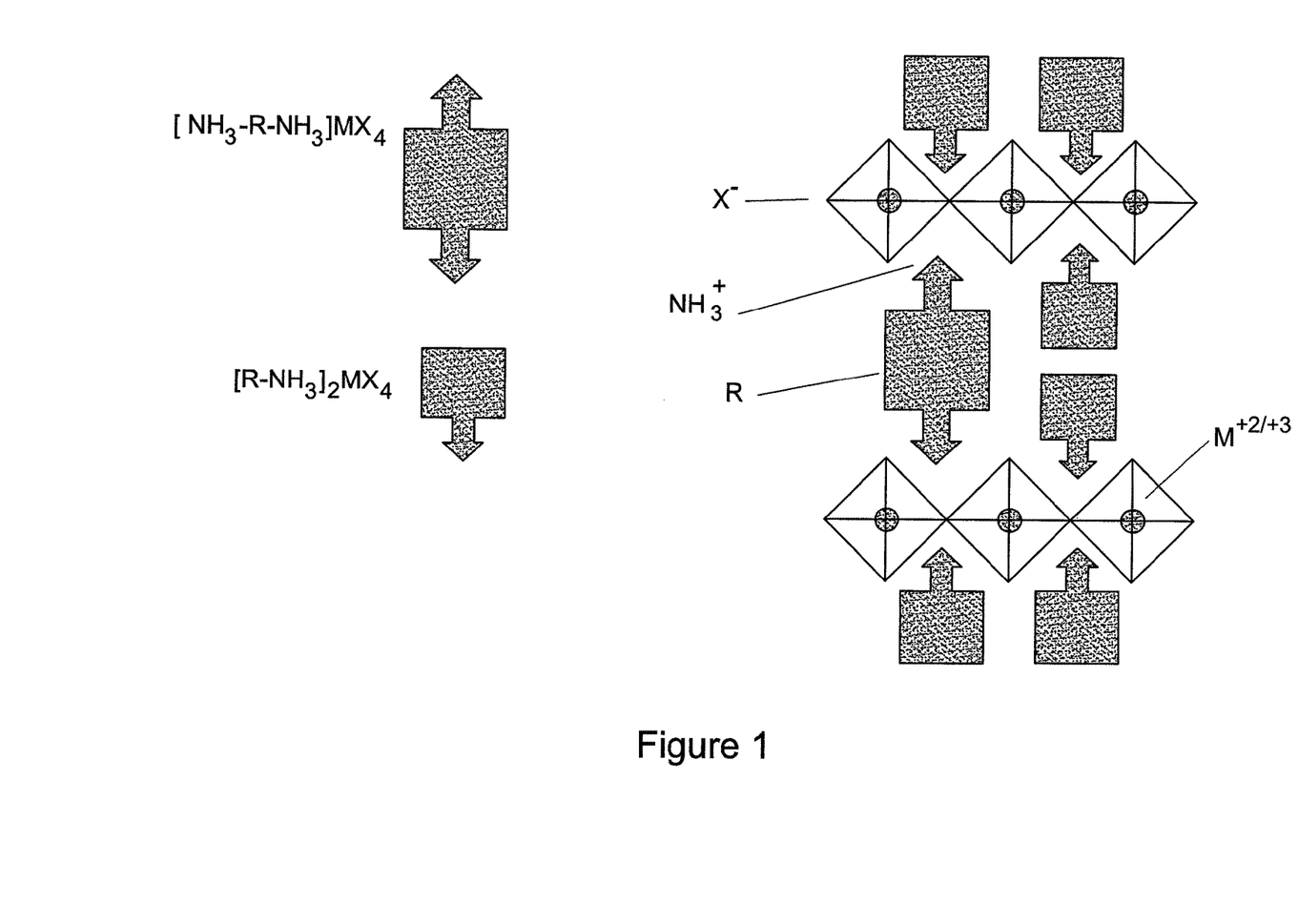
FIG. 1 depicts a single-layer oriented perovskite with mono-ammonium (R—$NH_3$+) or di-ammonium ($NH_3^+$—R—$NH_3^+$) organic cations. The divalent ($M_2^+$) metals generally occupy the metal site.

In some embodiments, the perovskite structure is an organic-inorganic perovskite structure. In some embodiments, the organic-inorganic perovskite structure is selected from $(R-NH_3)_2MX_4$ and $(NH-R-NH)MX$; (wherein X may be $Cl^{-1}$, $Br^{-1}$, or $I^{-1}$), the perovskite structure schematically depicted in FIG. 1. The inorganic layers may consist of sheets of corner-sharing metal halide octahedra. The M cation may be a divalent or trivalent metal that satisfies charge balancing and adopts octahedral anion coordination.

The inorganic layers, usually referred to as perovskite sheets, are derived from the three dimensional $AMX_3$ perovskite structure, by typically making a one-layer-thick cut along the <100> direction of the three-dimensional crystal lattice. The structural modifications may be achieved by changing the compositions of the organic and inorganic salts in the starting solution to enable tailoring the electronic, optical, and magnetic properties.

In some embodiments, the organic cation is an organic monovalent cation.

In some embodiments, the organic cation is a primary, a secondary, a tertiary or a quaternary organic ammonium compound, including N-containing heterorings and ring systems.

In some embodiments, the organic cation is a carbon (hydrocarbon) chain comprising one or more heteroatoms. The heteroatoms may be selected from N, O and S. In some embodiments, the number of heteroatoms is 1 or 2 or 3.

In some embodiments, the heteroatom is nitrogen atom.

In some embodiments, the carbon chain comprises one or more halogens.

In some embodiments, the carbon chain comprises a heterocyclyl and/or a heteroaryl.

In some embodiments, the organic cation is a monovalent or a bivalent cation or any other valence number, which may be a primary, a secondary, a tertiary or a quaternary organic ammonium compound having two positively charged nitrogen atoms.

In some embodiments, in a perovskite structure as defined above, the cation (A or A') is an organic cation selected from $(RR'R''R'''N)^+$, wherein each of the R groups may be selected independently as defined herein In some embodiments the cation is selected from $RNH_3$, $RR'NH_2$, $RR'R''NH$, $NH_3RNH_3$ or any combination thereof. In some embodiments, the cation is selected from $RNH=R'$, $NH_2=R$, $RN=R'R''$, $R'=N=R$, $RR'N=R=NR''R'''$, $H_2N=R=NH_2$, $RR'N=CHNR''R'''$. In some embodiments, the cation is $(H_2N=CHNH_2)^+$ or any combination thereof.

In some embodiments, the perovskite material is of the formula $AMX_3$.

In further embodiments, the perovskite material is of the formula $AMX'X_2$.

In yet further embodiments, the perovskite material is of the formula $RNH_3MX'X_2$.

In some embodiments, the perovskite material comprises or is selected from $CH_3NH_3PbF_3$, $CH_3NH_3PbCl_3$, $CH_3NH_3PbI_3$, $CH_3NH_3PbBr_3$, $CH_3NH_3PbBrI_2$, $CH_3NH_3PbBrCl_2$, $CH_3NH_3PbIBr_2$, $CH_3NH_3PbICl_2$, $CH_3NH_3PbClBr_2$ and $CH_3NH_3PbI_2Cl$. In some embodiments, the perovskite material comprises or is selected from $CH_3NH_3SnICl_2$, $CH_3NH_3SnBrI_2$, $CH_3NH_3SnBrCl_2$, $CH_3NH_3SnF_2Br$, $CH_3NH_3SnIBr_2$, $CH_3NH_3SnF_2I$, $CH_3NH_3SnClBr_2$, $CH_3NH_3SnI_2Cl$ and $CH_3NH_3SnF_2Cl$.

In further embodiments, the perovskite material is of the formula $RNH_3MX_3$. In some embodiments, the perovskite material comprises or is selected from $CH_3NH_3PbF_3$, $CH_3NH_3PbCl_3$, $CH_3NH_3PbI_3$ and $CH_3NH_3PbBr_3$. In some embodiments, the perovskite material is $CH_3NH_3PbI_3$.

In further embodiments, the perovskite material is of the formula $(NH_2=CH-NH_2)MX_3$. In some embodiments, the perovskite material comprises or is selected from $(NH_2=CH-NH_2)PbBr_3$, $(NH_2=CH-NH_2)PbI_3$, $(NH_2=CH-NH_2)PbCl_3$, $(NH_2=CH-NH_2)PbFCl_2$, $(NH_2=CH-NH_2)PbBrCl_2$, $(NH_2=CH-NH_2)PbICl_2$, $(NH_2=CH-NH_2)PbFCl_2$, $(NH_2=CH-NH_2)PbFBr_2$, $(NH_2=CH-NH_2)PbFI_2$ and $(NH_2=CH-NH_2)PbIBr_2$.

In further embodiments, the perovskite material is of the formula $AMX_3$, wherein M is metal cation, i.e., $M'MX_3$. In further embodiments, the perovskite material is of the formula $M'MX'X_2$. In some embodiments, the perovskite material comprises or is selected from $CsPbI_2Cl$, $CsPbICl_2$, $CsPbI_2F$, $CsPbIF_2$, $CsPbI_2Br$ and $CsPbIBr_2$.

In some embodiments, the perovskite material comprises or is selected from $CsSnI_2F$, $CsSnIF_2$, $CsSnI_2Cl$, $CsSnICl_2$, $CsSnI_2Br$ and $CsSnIBr_2$.

The perovskite layer in a photovoltaic cell according to the invention has a band gap adequate to the end application. In some embodiments, the band gap is in the visible regime. In some embodiments, the band gap is in the IR regime. In some embodiments, the band gap is in the near IR regime.

In some embodiments, the band gap is below 3 eV. In some embodiments, the band gap is below 2.5 eV. In some embodiments, the band gap is below 2 eV. In some embodiments, the band gap is between 0.1 to 3 eV. In some embodiments, the band gap is between 0.5 to 3 eV. In some embodiments, the band gap is between 1 to 3 eV. In some embodiments, the band gap is between 1 to 2.5 eV. In some embodiments, the band gap is between 1 to 2.0 eV.

The thickness of the perovskite layer depends inter alia on the perovskite material, number of layers within the overall layer, degree of interaction between the layers, and other parameters. The thickness of the perovskite layer may be determined by the desired application. For some end applications the thickness of the perovskite layer may be in the micrometer regime (1 to 1000 micrometer). For some applications, the thickness of the perovskite layer may be in the nanometer regime (1 to 1000 nm).

Thus, in some embodiments, the thickness of the perovskite layer is between 10 nm and 100 µm. In some embodiments, the thickness of the perovskite layer is between 100 nm and 10 µm.

In some embodiments, the thickness of the perovskite layer is smaller than 1000 µm. In some embodiments, the thickness of the perovskite layer is smaller than 100 µm. In some embodiments, the thickness of the perovskite layer is smaller than 10 µm. In some embodiments, the thickness of the perovskite layer is smaller than 10 µm. In some embodiments, the thickness of the perovskite layer is smaller than 1 µm.

In some embodiments, the thickness of the perovskite layer is smaller than 500 µm. In some embodiments, the thickness of the perovskite layer is smaller than 50 µm. In some embodiments, the thickness of the perovskite layer is smaller than 5 µm.

In some embodiments, the thickness of the perovskite layer is smaller than 1000 nm. In some embodiments, the thickness of the perovskite layer is smaller than 100 nm. In some embodiments, the thickness of the perovskite layer is smaller than 10 nm. In some embodiments, the thickness of the perovskite layer is smaller than 1 nm In some embodiments, the thickness of the perovskite layer is smaller than 500 nm In some embodiments, the thickness of the perovskite layer is between about 100 nm and 500 nm The perovskite layer is provided directly or indirectly on a "substrate" which may be a flexible or rigid substrate, which may be substantially two-dimensional (a thin flat substrate) or a three-dimensional curved (non-flat) surface. The substrate can be of any smoothness. In most general terms, the substrate may be of a solid material such as glass, paper, a semiconductor inorganic or organic, a polymeric material or a ceramic surface. The surface material, being the substrate on which the perovskite layer is formed, may not necessarily be of the same material as the bulk of the object on the surface of which the perovskite layer is produced.

In some embodiments, the substrate is flexible.

In some embodiments, the substrate is conductive.

In some embodiments, the substrate is transparent.

In some embodiments, the substrate is transparent to all wavelengths used in the end application. In some embodiments, the substrate is transparent to all wavelengths used in a solar cell. In some embodiments, the substrate is transparent in the visible spectral regime. In some embodiments, the substrate is transparent in the NIR and/or IR spectral regime. In some embodiments, the substrate is transparent in the visible-IR spectral regime.

In some embodiments, the substrate is conductive and transparent.

In some embodiments, the substrate is an inorganic semiconductor material selected from silicon, tin, compounds of boron, tellurium, geranium, gallium, gallium arsenide (GaAs), gallium phosphide (GaP), cadmium telluride (CdTe), gallium aluminum arsenide (GaAlAs), indium phosphide (InP), gallium arsenide phosphide (GaAsP), cadmium sulfide (CdS), copper indium gallium diselenide (CIGS), mercury cadmium telluride (HgCdTe), and copper indium sulfide or selenide.

In some embodiments, the substrate may be selected from glass, porous glass, quartz, indium tin oxide (ITO), fluorinated tin oxide (FTO), antimony doped tin oxide (ATO), mica, $SrGeO_3$ or zinc oxide. In further embodiments, the substrate may be selected from $SnO_2$:F, $SnO_2$:Sb, $In_2SO_3$:Sn, ZnO:Al, ZnO:$Al_2O_3$, ZnO:$Ga_2O_3$.

In some embodiments, the substrate is indium tin oxide (ITO) or fluorinated tin oxide (FTO).

In some embodiments, the substrate is formed of a polymeric material (conductive polymer), such as polyazulenes, polyphenylenes, polypyrenes, polynaphthalenes, polyester (PET), polyimide, poly(pyrrole)s, (PPY), poly(thiophene)s (PT), poly(3,4-ethylenedioxythiophene) (PEDOT), polyazepines, polyindoles, polycarbazoles, poly(p-phenylene vinylene) (PPV), Poly(acetylene)s (PAC), poly(p-phenylene sulfide) (PPS), poly-3-hexyl thiophene (P3HT) and polyanilines In some embodiments, the substrate is a carbon substrate or HOPG (graphite).

In some embodiments, the substrate is or comprises a metal.

In some embodiments, the substrate comprises a transition metal selected from Sc, Ti, V, Cr, Mn, Fe, Ni, Cu, Zn, Y, Zr, Nb, Tc, Ru, Mo, Rh, W, Au, Pt, Pd, Ag, Mn, Co, Cd, Hf, Ta, Re, Os, Ir, Hg and any combination thereof.

In some embodiments, the substrate is a metallic substrate made of a metal selected from gold, silver, copper, platinum, nickel, palladium, titanium, iridium and any combination thereof.

In some embodiments, the substrate is a glass or a plastic substrate composed of a glass material coated with a conductive material such as $SnO_2$:F (FTO) or metal nanoparticles (e.g., Au and/or Ag nanoparticles).

In an element of the invention, a conductive layer is provided on top of the perovskite layer. In some embodiments, the conductive layer is or comprises a metal, either pure form or a metal alloy.

In some embodiments, the conductive layer comprises a transition metal selected from Sc, Ti, V, Cr, Mn, Fe, Ni, Cu, Zn, Y, Zr, Nb, Tc, Ru, Mo, Rh, W, Au, Pt, Pd, Ag, Mn, Co, Cd, Hf, Ta, Re, Os, Ir, Hg and any combination thereof.

In further embodiments, the conductive layer comprise a metal, such as gold, silver, copper, platinum, nickel, palladium, titanium, iridium or any combination thereof.

In yet further embodiments, the conductive layer comprise Au and/or Ag.

In some embodiments, the conductive layer is a carbon substrate or HOPG (graphite).

In some embodiments, the conductive layer is an inorganic semiconductor material, including but not limited to, silicon, tin, compounds of boron, tellurium, geranium, gallium, gallium arsenide (GaAs), gallium phosphide (GaP), cadmium telluride (CdTe), gallium aluminum arsenide (GaAlAs), indium phosphide (InP), gallium arsenide phosphide (GaAsP), cadmium sulfide (CdS), copper indium gallium diselenide (CIGS), mercury cadmium telluride (HgCdTe), and copper indium sulfide or selenide.

In some embodiments, the conductive layer is flexible.

In some embodiments, the conductive layer is transparent.

In some embodiments, the conductive layer is transparent to all wavelengths used in an end application. In some embodiments, the conductive layer is transparent to all wavelengths used in a solar cell. In some embodiments, the conductive layer is transparent in the visible spectral regime. In some embodiments, the conductive layer is transparent in the NIR and/or IR spectral regime. In some embodiments, the conductive layer is transparent in the visible-IR spectral regime.

In some embodiments, the substrate may be selected from glass, porous glass, quartz, indium tin oxide (ITO), fluorinated tin oxide (FTO) and mica.

In some embodiments, the conductive layer is a polymer (conductive polymer), such as polyazulenes, polyphenylenes, polypyrenes, polynaphthalenes, polyester (PET), polyimide, poly(pyrrole)s, (PPY), poly(thiophene)s (PT), poly(3,4-ethylenedioxythiophene) (PEDOT), polyazepines, polyindoles, polycarbazoles, poly(p-phenylene vinylene) (PPV), Poly(acetylene)s (PAC), poly(p-phenylene sulfide) (PPS), poly-3-hexyl thiophene (P3HT), and polyanilines The thickness of the perovskite layer may be determined by the desired application. For some end applications the thickness of the perovskite layer may be in the micrometer regime (1 to 1000 micrometer). For some applications, the thickness of the perovskite layer may be in the nanometer regime (1 to 1000 nm).

Thus, in some embodiments, the thickness of the perovskite layer is between 10 nm and 100 μm. In some embodiments, the thickness of the perovskite layer is between 100 nm and 10 μm.

In some embodiments, the thickness of the perovskite layer is smaller than 1000 μm. In some embodiments, the thickness of the perovskite layer is smaller than 100 μm. In some embodiments, the thickness of the perovskite layer is smaller than 10 μm. In some embodiments, the thickness of the perovskite layer is smaller than 10 µm. In some embodiments, the thickness of the perovskite layer is smaller than 1 µm.

In some embodiments, the thickness of the perovskite layer is smaller than 500 µm. In some embodiments, the thickness of the perovskite layer is smaller than 50 µm. In some embodiments, the thickness of the perovskite layer is smaller than 5 µm.

In some embodiments, the thickness of the perovskite layer is smaller than 1000 nm. In some embodiments, the thickness of the perovskite layer is smaller than 100 nm. In some embodiments, the thickness of the perovskite layer is smaller than 10 nm. In some embodiments, the thickness of the perovskite layer is smaller than 1 nm. In some embodiments, the thickness of the perovskite layer is smaller than 500 nm In some embodiments, the thickness of the perovskite layer is between about 100 nm and 500 nm The element of the invention, as defined hereinabove, comprises a substrate, at least one perovskite layer and a conductive layer, wherein the perovskite layer and the conductive layer are stacked (provided, applied) directly on each other. In other words, the two layers are in intimate contact with each other without any intervening layer or material. Where an intervening layer exists, it is not a scaffold structure layer, e.g., $TiO_2$.

The intervening layer (herein referred to as the "additional layer") which is not a scaffold structure layer (e.g., $TiO_2$ layer), and which, in some embodiments, may be positioned between the perovskite layer and the substrate may be one or more additional layer(s) is usually one or more layers that assist in optimizing the operation or function of the element (solar cell) at the end application (when integrated in a device).

In some embodiments, the at least one additional layer is not a scaffold structure as defined herein.

In some embodiments, the at least one additional layer comprises a metal oxide or specifically $TiO_2$, wherein the at least additional layer is not one which substantially increases the effective surface area of the substrate, and optionally the at least one additional layer is present between the substrate and the perovskite layer.

In some embodiments, the at least one additional layer comprises a metal oxide or specifically $TiO_2$, wherein the at least one additional layer is not a porous layer or a layer comprising a fine powder, and optionally the at least one additional layer is present between the substrate and the perovskite layer.

In some embodiments, the at least one additional layer comprises a metal oxide or specifically $TiO_2$, wherein the at least one additional layer is not nanostructured and/or nanoporous, and optionally the at least one additional layer is present between the substrate and the perovskite layer.

In some embodiments, the at least one additional layer comprises a metal oxide or specifically $TiO_2$, wherein the at least one additional layer does not comprise powder (particles) in form of nanoparticles, and optionally the at least one additional layer is present between the substrate and the perovskite layer.

In some embodiments, the at least one additional layer comprises a metal oxide or specifically $TiO_2$, wherein the at least one additional layer does not comprise powder (particles) in form of nanoparticles, having a diameter in the range of a few hundreds to a few nanomemeters, and optionally the at least one additional layer is present between the substrate and the perovskite layer.

In some embodiments, the at least one additional layer comprises a metal oxide or specifically $TiO_2$, wherein the at least one additional layer does not comprise powder (particles) in form of nanoparticles, having nanoparticles size between 1 nm and 500 nm, and optionally the at least one additional layer is present between the substrate and the perovskite layer.

In some embodiments, the at least one additional layer comprises a metal oxide or specifically $TiO_2$, wherein the at least one additional layer does not comprise powder (particles) in form of nanoparticles, having nanoparticles size is between 1 nm and 300 nm, and optionally the at least one additional layer is present between the substrate and the perovskite layer.

In some embodiments, the at least one additional layer comprises a metal oxide or specifically $TiO_2$, wherein the at least one additional layer does not comprise powder (particles) in form of nanoparticles, having nanoparticles size is between 3 nm and 300 nm, and optionally the at least one additional layer is present between the substrate and the perovskite layer.

In some embodiments, the at least one additional layer comprises a metal oxide or specifically $TiO_2$, wherein the at least one additional layer does not comprise powder (particles) in form of nanoparticles, having nanoparticles size is between 3 nm and 200 nm, and optionally the at least one additional layer is present between the substrate and the perovskite layer.

In some embodiments, the at least one additional layer comprises a metal oxide or specifically $TiO_2$, wherein the at least one additional layer increases the surface area per volume of the substrate surface or of the surface in (direct) contact with the perovskite layer by less than 1.1 or 1.2 or 1.25 or 1.5 or 1.75 or 2 or 2.5 or 3 or 3.5 or 4 or 4.5 or 5, and optionally the at least one additional layer is present between the substrate and the perovskite layer.

The number of additional layers in an element of the invention is unlimited. In some embodiments, the number of additional layers is between 1 and 100. In other embodiments, the number of additional layers is between 1 and 50. In further embodiments, the number of additional layers is between 1 and 10. In further embodiments, the number of additional layers is 1 or 2 or 3 or 4 or 5 or 6 or 7 or 8 or 9 or 10.

In some embodiments, the additional layer is flexible.
In some embodiments, the additional layer is conductive.
In some embodiments, the additional layer is transparent.
In some embodiments, the additional layer is transparent to all wavelengths used in the end application. In some embodiments, the additional layer is transparent to all wavelengths used in a solar cell. In some embodiments, the additional layer is transparent in the visible spectral regime. In some embodiments, the additional layer is transparent in the NIR and/or IR spectral regime. In some embodiments, the additional layer is transparent in the visible-IR spectral regime.

In some embodiments, at least one additional layer is positioned between the perovskite layer and the substrate. In some embodiments, at least one additional layer is positioned between the perovskite layer and the conductive layer. In some embodiments, at least one additional layer is positioned between at least two perovskite layers (in a multilayer perovskite layer). In some embodiments, at least two additional layers are provided on each layer or substrate (e.g., below, above and between the perovskite (multi)layer(s)).

In some embodiments, the additional layer is a protective layer. The protective layer may be made of a thin inorganic material or another metal oxide layer with a wide band gap for the purpose of blocking the back reaction from the perovskite to the metal contact.

In some embodiments, the protective layer is an anti-reflecting layer. In some embodiments, the protective layer is of a dielectric material.

In further embodiments, the protective layer is a metal oxide, such as SiO, $SiO_2$, $Si_3N_4$, $TiO_2$, $Ta_2O_5$, $Al_2O_3$, $ZrO_2$, $Nd_2O_3$, $MgF_2$, MgO, $SrF_2$, ZnO, $MoO_3$, In—ZnO and $Hf_2O$. Where the protective layer is of a scaffold structure material, e.g., $TiO_2$, it is not positioned between the substrate and the perovskite material.

In some embodiments, the protective layer is a moisture barrier to protect moisture induced instability. In other embodiments, the protective layer is a thermal conductor to assist in minimizing hot-spot heat degradation.

In some embodiments, the protective layer comprises fluorinated polymers.

In other embodiments, the additional layer is a hole-transport material. The hole transport material may be made of conductive polymer such as OMETAD Spiro, polyazulenes, polyphenylenes, polypyrenes, polynaphthalenes, polyester (PET), polyimide, poly(pyrrole)s, (PPY), poly(thiophene)s (PT), poly(3,4-ethylenedioxythiophene) (PEDOT), polyazepines, polyindoles, polycarbazoles, poly(p-phenylene vinylene) (PPV), Poly(acetylene)s (PAC), poly(p-phenylene sulfide) (PPS), poly-3-hexyl thiophene (P3HT), and polyanilines In some embodiments, the protective layer is ITO or FTO.

The term "layer" used with reference to any of the mono-, bi- or otherwise multilayer structures mentioned herein, is meant to signify a full layer, or film, on top or below a different layer or film, or one or more spaced apart regions of one material covering a different layer of a different material. The spaced apart regions may be regions of a material(s) (layer and/or stacked layers) separated by a region(s) of atoms (material) of a different material or other layer or stacked layers (comprising e.g., different type of perovskite layers and/or arrangement of the perovskite layers) or material-free region(s). In some embodiments, the layer is a partial layer. In some embodiments the partial layer is continuous or comprising separate regions (spaced apart, non-connected).

In some embodiments, the conductive layer partially covers the perovskite layer or one or more additional layer(s). In some embodiments, the perovskite layer partially covers the substrate.

The layers of the invention (all or some), including the stacked layers may be in a certain pattern on the substrate. The pattern may be repetitive or random. The pattern may be of any shape, e.g., repetitive or non repetitive cubes, rings, circles, strips, grid. The pattern size may be in the nanometer scale or in the micrometer scale or in the millimeter scale.

The thickness of an element of the invention depends on the thickness of each of the layers and substrate. The thickness of the element may be in the millimeter regime or micrometer regime or the nanometer regime. The thickness of the element (with or without the substrate) may be between 1 nm and 100 mm. In some embodiments, the thickness of the element (with or without the substrate) may be between 1 nm and 100 µm. In some embodiments, the thickness of the element (with or without the substrate) may be between 10 nm and 100 µm. In some embodiments, the thickness of the element (with or without the substrate) may be between 10 nm and 10 µm.

In some embodiments, the element (including substrate) of the invention is flexible. In other embodiments, the element of the invention, excluding the substrate, is flexible.

In some embodiments, the element of the invention is in a solid state.

In another aspect, the invention provides a method for forming an element of the invention, the method comprising:

obtaining a substrate;
optionally, placing (or applying or depositing) at least one additional layer on the substrate;
placing (or applying or depositing) at least one perovskite layer on a substrate or on at least one additional layer; and
placing (or applying or depositing) a conductive layer on top of said perovskite layer or on at least one additional layer;

to thereby obtain the element of the invention, as defined.

The materials comprising the substrate, the perovskite layer, the conductive layer, and/or the additional layer used in the invention may be pre-made (commercially available) or synthesized prior to placing on the substrate. The substrate and/or at least one perovskite layer and/or conductive layer and/or at least one additional layer may be formed concomitant with or after the applying step, e.g., the perovskite layer may be formed when applied on the substrate. The formation may comprise several steps, e.g., applying the perovskite precursors on the substrate and may be subsequently heated.

In some embodiments, the perovskite layer is formed when or after placing it on the substrate. In some embodiments, the perovskite layer (perovskite material or species) is formed on the substrate by placing (coating) simultaneously on the substrate at least one metal precursor and at least one organic precursor. In other embodiments, the perovskite layer is formed on the substrate by placing (coating) on the substrate at least one metal precursor and subsequently placing (coating) at least one organic precursor, or vice versa.

In some embodiments, the substrate is thermally treated subsequent to or concomitant with at least one of the steps of placing the perovskite precursors (either simultaneously or separately).

In some embodiments, the thermal treatment comprises heating to above 50° C. In some embodiments, the thermal treatment comprises heating between 50° C. to 400° C. In some embodiments, the thermal treatment comprises heating between 50° C. to 200° C. In some embodiments, the thermal treatment comprises heating between 100° C. to 200° C. In some embodiments, the thermal treatment comprises heating between 100° C. to 150° C. In some embodiments, the thermal treatment comprises heating between 50° C. to 100° C. In some embodiments, the thermal treatment comprises heating to 70° C.

In some embodiments, the method of the invention comprises one or more steps of pre-treating or post-treating the surface of the substrate or any layer thereon. The pre-treatment or the post-treatment may include, in a non-limiting fashion, solvent or chemical washing (e.g., by a non-liquid medium such as a gas), etching, heating, deposition of an optionally patterned intermediate layer, as well as further surface treatments such as plasma treatment, UV-ozone treatment, or corona discharge.

The placing step may be performed by any protocol and means known in the art. In some embodiments, the means for layer placement is by deposition. In some embodiments, the deposition means is selected from dipping, spin coating, roll coating, spraying, dispensing, printing, ink-jet printing, lithography, stamping, drop casting and any combination thereof.

In some embodiments, the placing step is by printing. In further embodiments, the placing step is by ink jetting.

As the method of the invention may use a variety of printing steps, the layers, as well as the stacked layers of the invention may be patterned.

In another aspect, the invention provides a method for forming a perovskite layer on a substrate, the method comprising:

obtaining a substrate;

placing at least one perovskite precursor comprising a metal element (or organic species) on a substrate and optionally subjecting said precursor to thermal (or pre or post) treatment; and placing at least one perovskite precursor comprising organic species (or metal element) on a substrate;

to thereby obtain the perovskite layer.

In another aspect, the invention provides an element of the invention formed according to the process of the invention. In some embodiments, the element of the invention is formed at low temperatures.

In some embodiments, the element of the invention is formed at a temperature below or at 600° C. In other embodiments, the element of the invention is formed at a temperature below or at 500° C. In yet other embodiments, the element of the invention is formed at a temperature below or at 400° C. In yet other embodiments, the element of the invention is formed at a temperature below or at 300° C. In yet other embodiments, the element of the invention is formed at a temperature below or at 200° C. In yet other embodiments, the element of the invention is formed at a temperature below or at 150° C. In yet other embodiments, the element of the invention is formed at a temperature below or at 100° C.

In another aspect, the invention provides a heterojunction comprising or consisting an element of the invention. In some embodiments, the heterojunction is in a solid state.

The invention also provides a device implementing or comprising at least one element or a heterojunction of the invention.

In another aspect the invention provides a device comprising an active component (e.g., sensitizer or light harvester or light concentrator), the active component consisting a substrate, at least one perovskite layer, a conductive layer, and optionally at least one additional layer, wherein the at least one perovskite layer is provided on said substrate, either directly on the substrate or on said at least one additional layer, wherein said at least one additional layer being different from a scaffold structure layer.

In another aspect the invention provides a device comprising an active component, the active component consisting a substrate, at least one perovskite layer, a conductive layer, and optionally at least one additional layer, wherein said element is devoid of (or free of) a scaffold structure layer.

In another aspect the invention provides a device comprising an active component, the active component consisting a substrate, at least one perovskite layer, a conductive layer, and optionally at least one additional layer, wherein said element is devoid of a scaffold structure layer between the substrate and the perovskite layer.

In another aspect the invention provides a device comprising an active component, the active component consisting a substrate, at least one perovskite layer, a conductive layer, and optionally at least one additional layer, wherein the at least one perovskite layer is positioned directly on said substrate.

In the above embodiments, elements of the invention (including the substrate or not) may be an integral part of a device or may be a substrate which following its treatment as recited is implemented in a device. The device may be an electronic device or an optoelectronic device.

The elements or heterojunctions of the invention may be integrated in devices that require transmittance and/or efficient conversion of light including visible, UV, IR, and/or NIR regions of the electromagnetic spectrum. Such devices may be electrical-to-optical and/or optical-to-electrical transducers.

Also, such devices may be, for example, photoconductors and/or photodiodes and/or solar cells and/or luminescent concentrator, light emitting diodes (LEDs) and/or including organic light emitting diodes and lasers; and/or light sensors and/or pixel sensors, and/or specialized transistors and/or including organic transistors and/or inorganic transistors and/or hybrid transistors.

Other applications for utilization of elements of the invention may be related to printed electronics and/or touch screens and/or display backplanes and/or large or small area flexible applications.

The device of the invention may be used for optoelectronic applications and/or RF radio and/or power rectifier and/or light-dependent resistors (LDRs) and/or others.

In some embodiments, the element or heterojunction of the invention is a photovoltaic cell (a solar cell) device.

Thus, the invention also provides a solar cell comprising a substrate, at least one (e.g., organic-inorganic) perovskite layer, a conductive layer, and optionally at least one additional layer, wherein the at least one perovskite layer is provided on said substrate, either directly on the substrate or on said at least one additional layer, wherein said at least one additional layer being different from a scaffold structure layer.

The solar cell of the invention may further comprise a conductive layer which is the counter electrode of the cell and is made of a conductive material such as a metal. The counter electrode may be connected to the conductive support layer (conductive glass or plastic) either directly, or through a current collector which is connected to an external current.

The invention further provides a photovoltaic cell free of scaffold structure layer.

The element or heterojunction of the invention may be integrated into electronic devices, specifically, photovoltaic cells by forming the element as described herein on a substrate selected from glass, conductive glass, FTO, ITO, silicon (mono-crystalline or poly-crystalline), conductive polymers, metals, thin films which may consist semiconductor materials that are deposited by means such as CVD (chemical vapor deposition), PVD (pressure vapor deposition) and organic semiconductor substrates.

In some embodiments, the photovoltaic is deposited on conductive glass substrate.

In some embodiments, the elements or heterojunctions of the invention are luminescence solar (light) concentrators and the substrate may be silicon or glass (or any other). In some embodiments, the light concentrator is an element in a photovoltaic cell device.

In some embodiments, the elements or heterojunctions of the invention may be integrated as multi-cells array on a substrate obtaining solar panel device.

In some embodiments, the device of the invention is flexible and/or formed at low temperatures.

In some embodiments, the device of the invention operates at high currents.

BRIEF DESCRIPTION OF THE DRAWINGS

In order to better understand the subject matter that is disclosed herein and to exemplify how it may be carried out in practice, embodiments will now be described, by way of non-limiting example only, with reference to the accompanying drawings, in which:

FIGS. 2A-B provide a scheme of an exemplary perovskite schottky solar cell according to the invention: FIG. 2B—provides an energy level diagram. As shown, the light is absorbed by the layered perovskite, the conduction and the valence permitting electron injection and hole transportation to the metal and to the conductive transparent substrate, respectively.

DETAILED DESCRIPTION OF EMBODIMENTS

Solar cells known in the art generally utilize a cell structure comprising a scaffold layer in a 3-D matrix, increasing the surface area of the cell, which increases the cell efficiency by increasing the absorbed light per volume unit of the cell and/or reducing recombination incidents. Typically, scaffolding structure is provided by a semiconductor material, such as a metal oxide (titanium oxide). The scaffolding structure may be a substantially porous layer or a layer comprising a fine powder (may be particles in the scale of hundreds of nanometer or less).

In contrast to known solar cells, the present invention provides solar cells which do not require scaffold structure layers to operate. The perovskite layer is present directly or indirectly (as defined herein) on the substrate, without any intervening scaffold structure layer such as $TiO_2$.

Manner of Fabrication

The organic-inorganic perovskite is deposited by spin coating onto conducting transparent substrate, upon drying at room temperature the film change its color indicating the formation of the perovskite in the solid state. After deposition the perovskite film is annealed under argon for 15 min at 100° C. Finally, the counter electrode is deposited by thermal evaporation of metal.

Figure 2A:
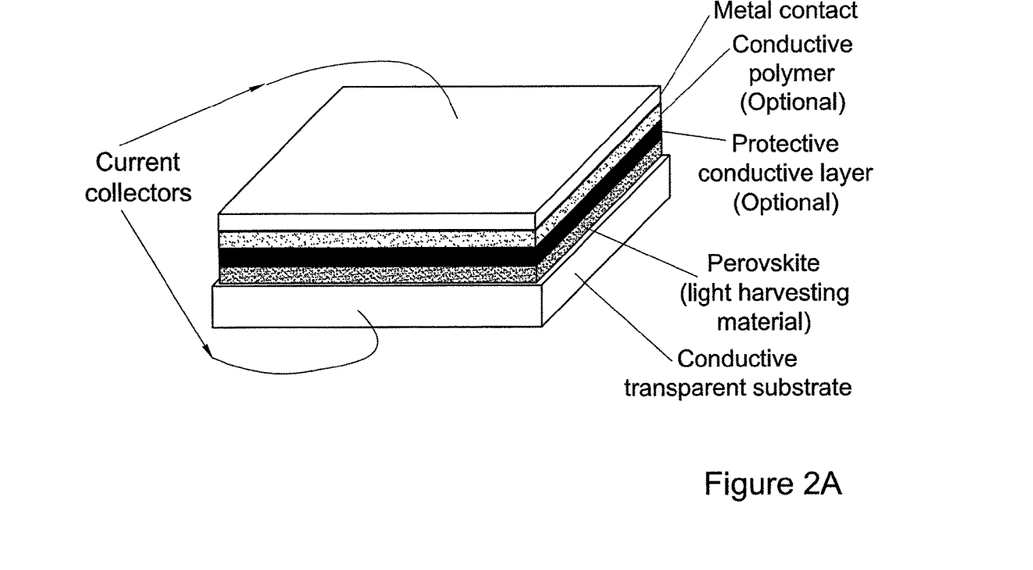
FIG. 2A—is a scheme of a solar cell structure.
Figure 2B:
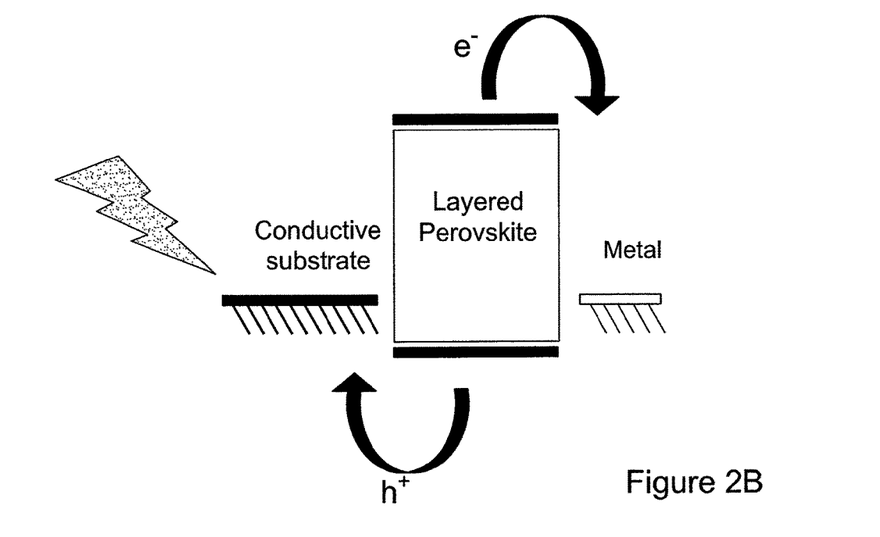

The solar cell structure is shown in FIG. 2. FIG. 2A provides a scheme of the solar cell structure; FIG. 2B depicts an energy level diagram, where light is absorbed by the layered perovskite, the conduction and the valence should permit electron injection and hole transportation to the metal and to the conductive transparent substrate, respectively.

Method and Device Fabrication

1. $CH_3NH_3I$ was synthesized as described earlier by reacting 30 mL of methylamine (40% in methanol, TCI) and 32.3 mL of hydroiodic acid (57 wt % in water, Aldrich) in a 250 mL round bottom flask at 0° C. for 2 h with stirring. The precipitate was recovered by putting the solution on a rotavap and carefully removing the solvents at 50° C. The yellowish raw product of methylammonium iodide ($CH_3NH_3I$) was washed with ethanol by stirring the mixture for 30 min. Then the mixture was filtered and washed with diethylether. The washing step was repeated three times. After filtration, the solid was collected and dried at 60° C. in a vacuum oven for 24 h.

Device Fabrication:

1. The substrate of the device was a $SnO_2$: F(FTO) conducting glass (15 $\Omega \cdot cm^{-1}$, Pilkington). A blocking layer was deposited on the FTO glass using a solution of titanium diisopropoxidebis(acetylacetonate)(TiDIP, 75% in isopropanol, Aldrich) in ethanol. The TiDIP solution was spin coated and then annealed at 450° C. for 35 min 2. The synthesis of $CH_3NH_3PbI_3$ on the substrate surface was carried out by a two-step deposition technique. At the beginning, $PbI_2$ was dropped onto the substrate and spin coated after various wait time periods (1 min, 1.5 min, 3 min, or 5 min) followed by annealing at 70° C. for 30 min. In the second step, the cell was dipped into 10 mg/ml of $CH_3NH_3I$ solution at 70° C. for 20 sec, and then annealed at 70° C. for another 30 min During the dip and the annealing, the $CH_3NH_3PbI_3$ was formed, indicated by the dark brown color of the electrode.

3. Finally, the back contact was deposited by evaporating 50 nm of gold under pressure of $5*10^{-6}$ Torr. The active area was 0.09 $cm^2$.

Figure 3A:
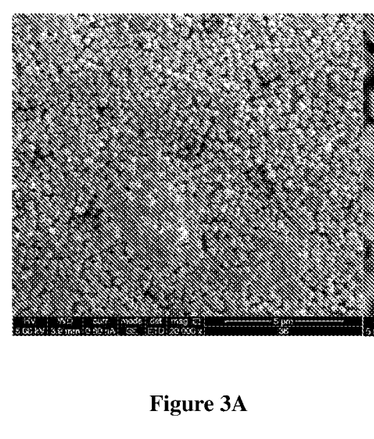
FIGS. 3A-B provide two high resolution SEM images, at different magnifications (FIG. 3A—magnification of 20,000 and FIG. 3B of 100,000), of $CH_3NH_3PbI_3$ perovskite crystals deposited on the FTO glass.
Figure 3B:
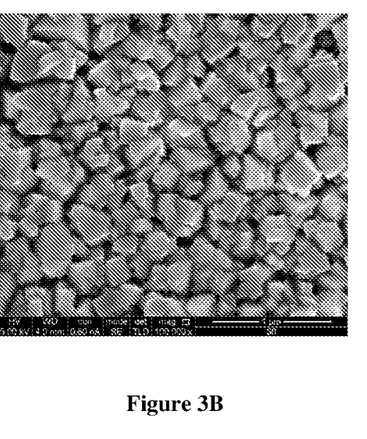

FIGS. 3A-B show high resolution SEM images of $CH_3NH_3PbI_3$ perovskite crystals deposited on the FTO glass. FIG. 3A is a low magnification while FIG. 3B is at a higher magnification. The $CH_3NH_3PbI_3$ crystals could be clearly observed in the uniform and continuous film of the perovskite.

The photovoltaic performance of the device based on perovskite cell consist of FTO glass, $CH_3NH_3PbI_3$ and gold as the back contact was measured and showed promising results.

The invention claimed is:

1. An element selected from the group consisting of:
   an element comprising a substrate, at least one perovskite layer having first and second opposing surfaces, a conductive layer, and optionally at least one additional layer, wherein all of the first surface of the at least one perovskite layer is provided directly on said substrate;
   an element comprising a substrate, at least one perovskite layer having first and second opposing surfaces, a conductive layer, optionally at least one additional layer, and further optionally at least one scaffold layer, wherein all of the first surface of the at least one perovskite layer is directly provided on said substrate; and
   an element comprising a substrate, at least one perovskite layer having first and second opposing surfaces, a conductive layer, and optionally at least one additional layer, wherein all of the first surface of the at least one perovskite layer is directly on said substrate and provides a planar junction,
   wherein in each of the elements, the conductive layer is in contact with the at least one perovskite layer, and wherein the at least one perovskite :layer comprises at least one perovskite material comprising an organic moiety,
   wherein in each of the elements, the at least one perovskite is a photoactive layer, and
   wherein said substrate is a single, continuous layer that is not a porous, nanoporous, nanoparticle or scaffold layer.

2. The element according to claim 1, wherein the perovskite material is of the formula selected from the group consisting of $AMX_3$, $AMX_4$, $A_2MX_4$, $A_3MX_5$, $A_2AMX_5$ and $AMX_{3-n}X'_n$ wherein
A and A' are independently selected from the group consisting of organic cations and any combination of organic and metal cations;
M is a metal cation or any combination of metal cations;
X and X' are independently selected from anions and any combination of anions; and
n is between 0 to 3.

3. The element according to claim 2, wherein the metal cation is selected from the group consisting of metal element of Groups IIIB, IVB, VB, VIB, VIIB, VIIIB, IB, IIB, IIIA, IVA and VA of block d of the Periodic Table of the Elements.

4. The element according to claim 2, wherein the organic cation is derived from an organic moiety selected from the group consisting of substituted or unsubstituted alkyl, substituted or unsubstituted alkenyl, substituted or unsubstituted alkynyl, substituted or unsubstituted cycloalkyl, substituted or unsubstituted cycloalkenyl, substituted or unsubstituted cycloalkynyl, substituted or unsubstituted aryl, substituted or unsubstituted heteroaryl, substituted or unsubstituted heterocyclyl, substituted or unsubstituted —$NR_1R_2$, substituted or unsubstituted —$OR_3$, substituted or unsubstituted —$SR_4$, substituted or unsubstituted —$S(O)R_5$, substituted or unsubstituted alkylene-COOH, and substituted or unsubstituted ester, wherein each of $R_1$, $R_2$, $R_3$, $R_4$ and $R_5$, independently, is selected from the group consisting of alkyl, alkenyl, alkynyl, cycloalkyl, cycloalkenyl, cycloalkynyl, aryl, heteroaryl, heterocyclyl, ester, and carbonyl.

5. The element according to claim 2, wherein the perovskite material is of the formula $(NH_2=CH—NH_2) MX_3$.

6. The element according to claim 2, wherein the perovskite material is of the formula $RNH_3MX'X_2$, wherein R is selected from the group consisting of alkyl, alkenyl, alkynyl, cycloalkyl, cycloalkenyl, cycloalkynyl, aryl, heteroaryl, heterocyclyl, alkylene-COOH, and ester.

7. The element according to claim 6, wherein the perovskite material comprises or is selected from the group consisting of $CH_3NH_3PbF_3$, $CH_3NH_3PbCl_3$, $CH_3NH_3PbI_3$, $CH_3NH_3PbBr_3$, $CH_3NH_3PbBrI_2$, $CH_3NH_3PbBrCl_2$, $CH_3NH_3PbIBr_2$, $CH_3NH_3PbICl_2$, $CH_3NH_3PbClBr_2$ and $CH_3NH_3PbI_2Cl$.

8. The element according to claim 2, wherein the perovskite material is of the formula $RNH_3MX_3$, wherein R is selected from the group consisting of alkyl, alkenyl, alkynyl, cycloalkyl, cycloalkenyl, cycloalkynyl, aryl, heteroaryl, heterocyclyl, alkylene-COOH, and ester.

9. The element according to claim 8, wherein the perovskite material comprises or is selected from the group consisting of $CH_3NH_3PbF_3$, $CH_3NH_3PbCl_3$, $CH_3NH_3PbI_3$ and $CH_3NH_3PbBr_3$.

10. The element according to claim 1, wherein the perovskite layer is a multilayer structure of layered perovskite materials, wherein each layer is different and comprises either a different species of a perovskite material, or a different mixture of several different species of perovskite materials.

11. The element according to claim 1, wherein the perovskite material is an organic-inorganic perovskite hybrid; and the organic cation is a carbon (hydrocarbon) chain comprising one or more heteroatoms, the heteroatoms being selected from N, O and S.

12. The element according to claim 11, wherein the organic cation is a primary, a secondary, a tertiary or a quaternary organic ammonium compound having one or two positively charged nitrogen atoms.

13. The element according to claim 12, wherein the organic cation is selected from $(RR'R''R'''N)^+$, wherein each of said R, R', R" and R''', independently of the other, being selected from the group consisting of hydrogen, alkyl, alkenyl, alkynyl, cycloalkyl, cycloalkenyl, cycloalkynyl, aryl, heteroaryl, heterocyclyl, halogen, alkylene-COOH, ester, —OH, —SH, and —NH, provided that at least one of said R, R', R" and R''' is an organic group.

14. The element according to claim 13, wherein the cation is selected from the group consisting of $RNH_3$, $RR'NH_2$, $RR'R''NH$, $NH_3RNH_3$, $RNH=R'$, $NH_2=R$, $RN=R'R''$, $R'=N=R$, $RR'N=R=NR''R'''$, $H_2N=R=NH_2$, and $RR'N=CHNR''R'''$.

15. The element according to claim 13, wherein the cation is $(H_2N=CHNH_2)^+$.

16. A heterojunction comprising or consisting an element according to claim 11.

17. A solar cell comprising an element according to claim 1.

* * * * *

UNITED STATES PATENT AND TRADEMARK OFFICE
CERTIFICATE OF CORRECTION

PATENT NO. : 10,079,356 B2
APPLICATION NO. : 14/652528
DATED : June 16, 2015
INVENTOR(S) : Lioz Etgar Page 1 of 1

It is certified that error appears in the above-identified patent and that said Letters Patent is hereby corrected as shown below:

Column 20, Claim 1, Line 60:
Please delete "one perovskite :layer comprises"
And replace with -- one perovskite layer comprises --

Column 22, Claim 16, Line 41:
Please delete "according to claim 11."
And replace with -- according to claim 1. --

Signed and Sealed this
Twenty-ninth Day of January, 2019

Andrei Iancu
*Director of the United States Patent and Trademark Office*